US007015509B2

(12) United States Patent
Aruga

(10) Patent No.: US 7,015,509 B2
(45) Date of Patent: Mar. 21, 2006

(54) ELECTROOPTIC DEVICE AND ELECTRONIC APPARATUS

(75) Inventor: Yasuhito Aruga, Matsumoto (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/948,105

(22) Filed: Sep. 23, 2004

(65) Prior Publication Data

US 2005/0092993 A1    May 5, 2005

(30) Foreign Application Priority Data

Sep. 24, 2003  (JP)  ............................. 2003-331672

(51) Int. Cl.
*H01L 29/04*    (2006.01)
*H01L 31/036*   (2006.01)
*H01L 31/062*   (2006.01)
*H01L 31/113*   (2006.01)

(52) U.S. Cl. ....................................... 257/72; 257/291
(58) Field of Classification Search ................ 257/72, 257/288–294
See application file for complete search history.

(56) References Cited

U.S. PATENT DOCUMENTS 6,882,390 B1 * 4/2005 Hinata et al. ............... 349/114

FOREIGN PATENT DOCUMENTS

JP           2572134         3/1988

* cited by examiner

Primary Examiner—Cuong Nguyen
(74) Attorney, Agent, or Firm—Harness, Dickey & Pierce, P.L.C.

(57) ABSTRACT

An electrooptic-device substrate includes a first IC-mounting area on which a first IC is mounted following a substrate edge of the electrooptic-device substrate, at least one second IC-mounting area on which a second IC is mounted, and a substrate-connection area to which a flexible substrate is connected, wherein the substrate-connection area is provided so as to be nearer the substrate edge than the first and second IC-mounting areas, and the electrooptic-device substrate includes a first wiring pattern extending from the first IC-mounting area to the substrate-connection area and a second wiring pattern that extending from the second IC-mounting area, between first pads formed in the first IC-mounting area and reaching the substrate-connection area.

14 Claims, 6 Drawing Sheets

F I G. 1
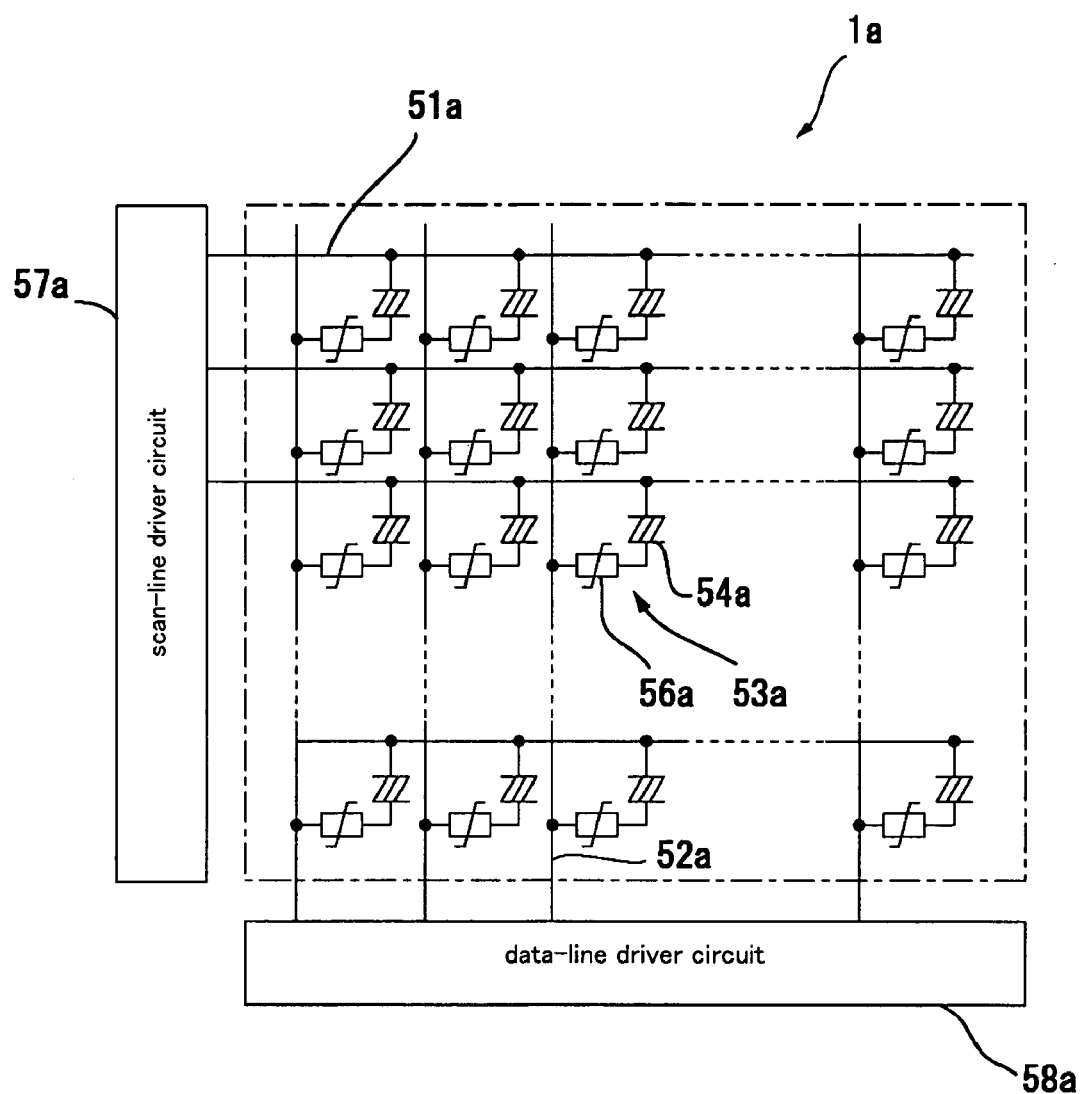

PRIOR ART

ELECTROOPTIC DEVICE AND ELECTRONIC APPARATUS

RELATED APPLICATIONS

This application claims priority to Japanese Patent Application No. 2003-331672 filed Sep. 24, 2003, which is hereby expressly incorporated by reference herein in its entirety.

BACKGROUND

1. Technical Field of the Invention

The present invention relates to an electrooptic device having an IC that is COG (chip on glass)-mounted on a substrate and an electronic apparatus including this electrooptic device.

2. Description of the Related Art

As shown in FIG. 6, for example, in electrooptic devices including an active-matrix liquid-crystal device, an organic electroluminescence display device, and so forth, a first IC mounting area 40 and second IC-mounting areas 50 and 60 are provided following a substrate edge 11 of an electrooptic-device substrate. A first IC 4 and second ICs 5 and 6 are mounted on the above-described IC-mounting areas 40, 50, and 60, respectively. Here, many wiring patterns extend linearly toward the substrate edge 11 from pads formed on the first IC-mounting area 40 and the second IC-mounting areas 50 and 60. The ends of the above-described wiring patterns form many substrate-connection ends on a substrate-connection area 70 on which a flexible substrate 7 is mounted. Here, a width W7 of the flexible substrate 7 extending in the direction following the substrate edge 11 is substantially the same as width W56 of a predetermined area extending in the direction following the substrate edge 11, where the predetermined area includes the first IC-mounting area 40 and the second IC-mounting areas 50 and 60. In an example shown in FIG. 6, the width W7 is substantially the same as the width of the electrooptic-device substrate.

However, when an electronic device is configured as a mobile phone including the electrooptic device shown in FIG. 6, the flexible substrate 7 may become an obstacle for providing a connector 81, a speaker 82, and so forth, near the substrate edge 11.

Therefore, there have been demands for decreasing the width W7 of the flexible substrate 7 (the substrate connection area). A technique for meeting the above-described demands has been proposed, wherein the pads on which the second ICs 5 and 6 are mounted and the pad on which the first IC 4 is mounted are connected to one another through the wiring patterns. Subsequently, part of the substrate-connection ends formed on the substrate-connection area is used in common, whereby the number of the substrate-connection ends decreases.

However, according to the above-described technique, the first IC 4 and the second ICs 5 and 6 share the use of the substrate-connection ends. Therefore, this technique cannot be used when the power-supply voltage of the first IC 4 and those of the second ICs 5 and 6 are different with one another, which imposes restrictions on IC design.

Accordingly, the object of the present invention is to provide an electrooptic device including a flexible substrate connected to a substrate edge, where the width of the flexible substrate can be reduced, even though multiple ICs are COG-mounted following the substrate edge, and an electronic apparatus including this electrooptic device.

SUMMARY

For solving the above-described problem, an electrooptic device according to the present invention comprises:
an electrooptic-device substrate including:
a substrate edge;
a first IC-mounting area and a second IC-mounting area aligned along the substrate edge, the first IC-mounting area being for mounting a first IC, the second IC-mounting area being for mounting a second IC; and
a substrate-connection area to which a flexible substrate is to be connected, the substrate-connection area being nearer the substrate edge than the first and second IC-mounting areas;
a first wiring pattern extending from the first IC-mounting area to the substrate-connection area; and
a second wiring pattern that extends from the second IC-mounting area, goes between first pads formed in the first IC-mounting area, and reaches the substrate-connection area.

In the present invention, the first wiring pattern extends substantially linearly from the first IC-mounting area toward the substrate-connection area and the second wiring pattern extends substantially linearly from between the first pads toward the substrate-connection area, for example.

In the present invention, it is preferable that an area in which the first wiring pattern is formed and an area in which the second wiring pattern is formed are adjacent to each other in a direction following the substrate edge of the electrooptic-device substrate. According to this configuration, a substrate-connection end used for applying a signal, a power-supply potential, and a ground potential from the flexible substrate to the first IC, and a substrate-connection end used for applying a signal, a power-supply potential, and a ground potential from the flexible substrate to the second IC can be integrated effectively. Subsequently, the width of the substrate-connection area extending in the direction following the substrate edge can be decreased.

According to the present invention, the second IC-mounting area can be provided in only one of the areas on both sides of the first IC-mounting area. Otherwise, the second IC-mounting area can be provided in each area on both sides of the first IC-mounting area. In this case, the first IC-mounting area is formed in a substantially center area of the electrooptic-device substrate, where the center area extends in the direction following the substrate edge, and the second IC-mounting area is formed on each of the areas on both sides of the first IC-mounting area extending in the direction following the substrate edge of the electrooptic-device substrate, for example.

In the present invention, it is preferable that a width of the substrate-connection area extending in the direction following the substrate edge is smaller than a width of a predetermined area including the first IC-mounting area and the second IC-mounting area, where the predetermined area extends in the direction following the substrate edge.

In the present invention, it is preferable that the width of the substrate-connection area extending in the direction following the substrate edge is equal to, or smaller than a width of the first IC-mounting area extending in the direction following the substrate edge.

In the present invention, it is preferable that the second wiring pattern is provided so that a single second wiring pattern goes through a gap between the first pads. According to this configuration, the gap between the first pads does not increase locally. Therefore, the stability for mounting the first IC does not decrease.

In the present invention, it is preferable that the second wiring pattern goes between dummy pads of the first pads and extends to the substrate-connection area, where a signal, a power-supply potential, and a ground potential are not applied from the flexible substrate to the dummy pads. According to this configuration, shorting of the dummy pads and the second wiring pattern presents no problem.

In the present invention, it is preferable that the first pads include a pad connected to a second pad formed in the second IC-mounting area by a third wiring pattern. It is also preferable that the pad is provided on an end of the first IC-mounting area, where the end is formed at a predetermined position near the second IC-mounting area, and the signal, the power-supply potential, and the ground potential are not directly applied from the flexible substrate to the pad. According to this configuration, the third wiring pattern can be easily arranged. The above-described bump does not require the substrate-connection end. Therefore, where the pad is provided, so as to be near the end, it becomes possible to decrease an area in which the substrate-connection end is formed by as much as an area corresponding to the pad.

In the present invention, it is preferable that the first pads include a pad to which a bump for testing the first IC is connected, and the pad is provided in the first IC-mounting area at a predetermined position that is nearer an end than a predetermined area, where the first pads are formed in the predetermined area and where the second wiring pattern extends therebetween. The pad to which the testing bump is connected does not require the substrate-connection end. Therefore, where the pad is provided, so as to be near the end, it becomes possible to decrease the area in which the substrate-connection end is formed by as much as an area corresponding to the pad.

The electrooptic-device substrate according to the present invention can be used for a liquid-crystal device. In this case, the electrooptic-device substrate holds a liquid crystal between the electrooptic-device substrate and another substrate opposing thereto, as the electrooptic material.

The electrooptic-device substrate according to the present invention can be used for an electroluminescence display device. In this case, the electrooptic-device substrate holds an organic electroluminescence material forming an electroluminescence element.

The electrooptic device according to the present invention may be used for an electronic apparatus including a mobile phone, a mobile computer, and so forth.

In the present invention, the first IC-mounting area and the second IC-mounting area are formed following the same substrate edge of the electrooptic-device substrate, and a flexible substrate is connected to the substrate-edge side rather than the IC-mounting-area side. Further, a first wiring pattern extends from the first IC-mounting area toward a substrate-connection area, and a second wiring pattern extending from the second IC-mounting area toward the substrate-connection area is provided, so as to extend between first pads formed on the first IC-mounting area. Therefore, a substrate-connection end for applying a signal, a power-supply potential, and a ground potential from the flexible substrate to the first IC, and a substrate-connection end for applying a signal, a power-supply potential, and a ground potential from the flexible substrate to the second IC can be provided in a converging manner. Therefore, it becomes possible to decrease the width of the substrate-connection area extending in the direction following the substrate edge. Subsequently, the width of the flexible substrate extending in the direction following the substrate edge can be decreased, so as to be substantially smaller than that of the electrooptic-device substrate. Therefore, where the electronic apparatus is configured as a mobile phone or the like by using the electrooptic device, a connector, a speaker, and so forth, can be easily provided near the substrate edge. Further, according to the present invention, the first IC and the second IC do not share the use of the substrate-connection ends. Therefore, the present invention can be used when the power-supply voltage of the first IC and that of the second IC are different from each other.

BRIEF DESCRIPTION OF THE DRAWINGS

FIG. 1 is a block diagram schematically illustrating the configuration of an electrooptic device including an active-matrix liquid-crystal unit using a non-linear element, as a pixel switching element.

DETAILED DESCRIPTION

Figure 6:
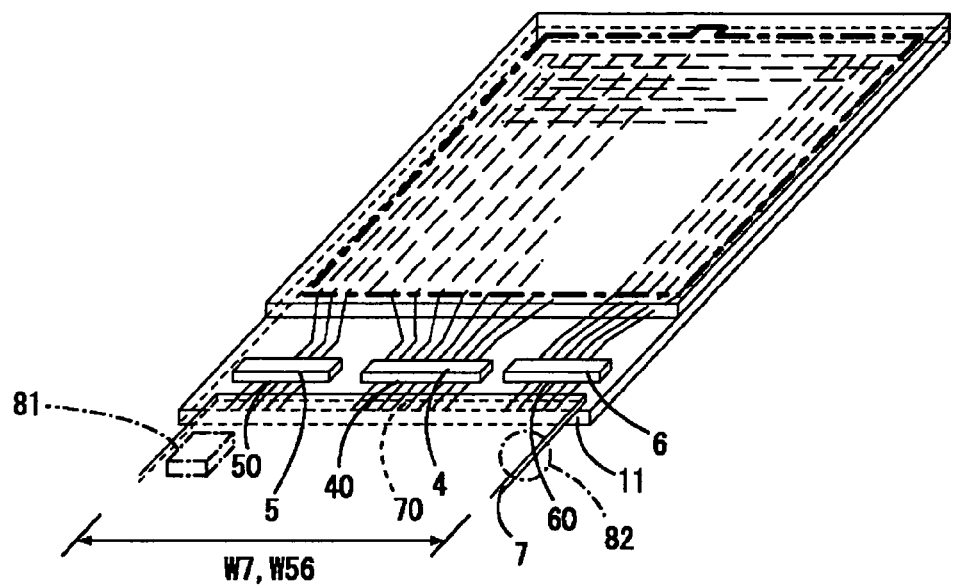
FIG. 6 is a schematic perspective view of a known electrooptic device viewed from the opposing-substrate side.

Embodiments of the present invention will now be described with reference to the attached drawings. The basic configuration of an electrooptic device according to the following embodiments is the same as in the case of FIG. 6. Therefore, parts having the same functions will be designated by the same reference characters and numerals.

Configuration of the Electrooptic Device

Figure 2A:
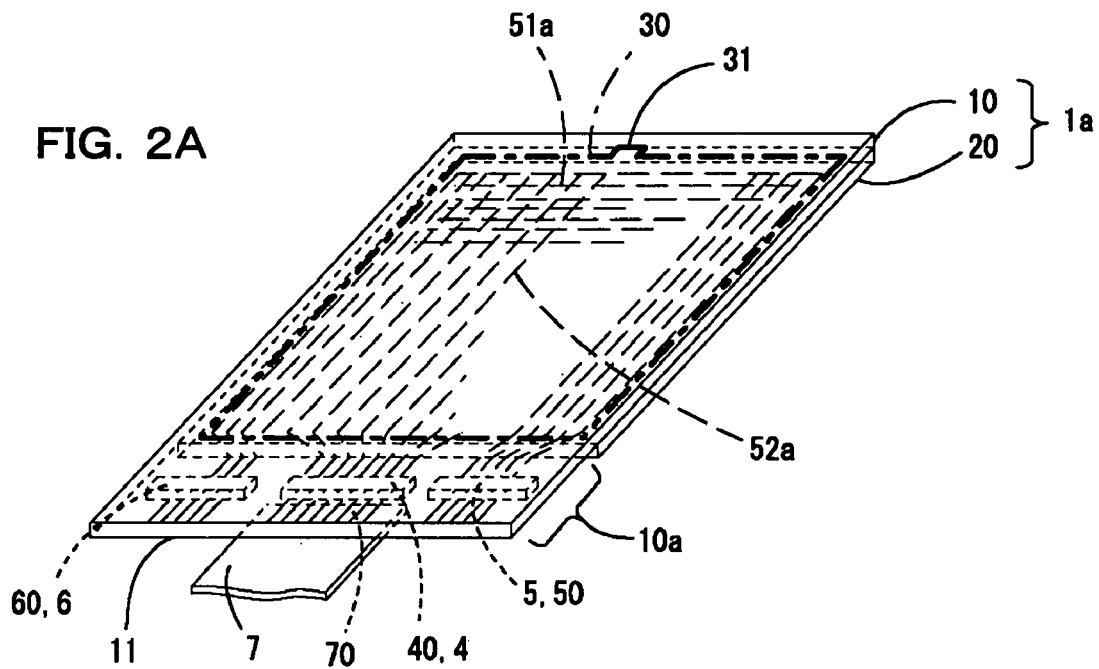
FIG. 2(A) is a schematic perspective view of the electrooptic device according to the present invention viewed from the element-substrate side and FIG. 2(B) is a schematic perspective view thereof viewed from the opposing-substrate side.
Figure 2B:
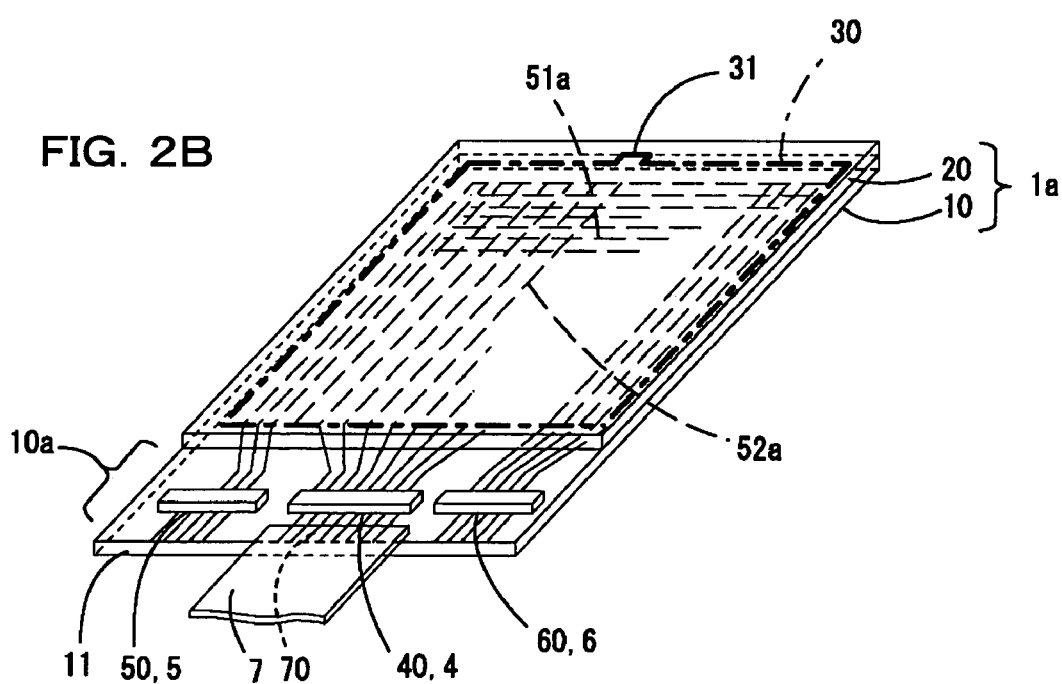

FIG. 1 is a block diagram illustrating an electrical configuration of the electrooptic device. FIGS. 2(A) and 2(B) are a schematic perspective view of the electrooptic device according to the present invention viewed from the element-substrate side and the schematic perspective view thereof viewed from the opposing-substrate side.

An electrooptic device 1a shown in FIG. 1 is an active-matrix liquid-crystal device using a TFD (thin film diode), as a pixel switching element. In this device, a plurality of scan lines 51a is provided in the row direction and a plurality of data lines 52a is formed in the column direction. A pixel 53a is provided at the position corresponding to each intersection of the scan lines 51a and the data lines 52a. In this pixel 53a, a liquid-crystal layer 54a and a TFD element 56a (non-linear element) for pixel switching are connected in series. Each of the scan lines 51a is driven by a scan-line driver circuit 57a and each of the data lines 52a is driven by a data-line driver circuit 58a.

For forming the above-described electrooptic device 1a, an element substrate 10 (electrooptic-device substrate) and an opposing substrate 20 are bonded together by using a sealing material 30, as shown in FIGS. 2(A) and 2(B). Further, a liquid crystal functioning as an electrooptic substance is sealed in an area surrounded by both the substrates and the sealing material 30. The sealing material 30 is formed as a substantially rectangular frame provided following the edge of the opposing substrate 20. An opening is formed at a predetermined part of the sealing material 30 so that the liquid crystal can be sealed therein. Therefore, the opening is sealed by a sealant 31 after the liquid crystal is sealed therein.

In practice, a polarization plate for polarizing incident light, a phase-difference plate for compensating for an interference color, and so forth, are placed over the outer surfaces of the element substrate 10 and the opposing substrate 20, as required. Since this configuration has no direct bearing on the present invention, it is not shown in the drawings and the description thereof is omitted.

The element substrate 10 and the opposing substrate 20 are formed as plate-like members having a light-transmission property, such as glass, quartz, plastic, and so forth. The plurality of data lines 52a, the TFD element (not shown) for pixel switching, and the pixel electrode (not shown) are formed on an inner (the liquid-crystal side) surface of the element substrate 10. Further, the plurality of scan lines 51a is formed on an inner surface of the opposing substrate 20. The element substrate 10 has an overhanging area 10a which overhangs from an outer circumferential edge of the sealing material 30 toward one side. The wiring patterns connected to the data lines 52a and the scan lines 51a extend toward the overhanging area 10a.

In this embodiment, many conductive particles having conductivity are scattered in the above-described sealing material 30. These conductive particles include particles made of metal-plated plastic and particles made of a resin having conductivity, for example, and make the wiring patterns formed on the element substrate 10 and the opposing substrate 20 conduct to one another and function as a spacer for keeping a gap (cell gap) between the substrates constant. Therefore, according to this embodiment, the first IC 4 for outputting an image signal to the data line 52a and the two second ICs 5 and 6 for outputting a scan signal to the scan line 51a are COG-mounted on the overhanging area 10a of the element substrate 10. Further, the flexible substrate 7 is connected to the overhanging area 10a of the element substrate 10.

Configuration of the IC-Mounting Area

Figure 3A:
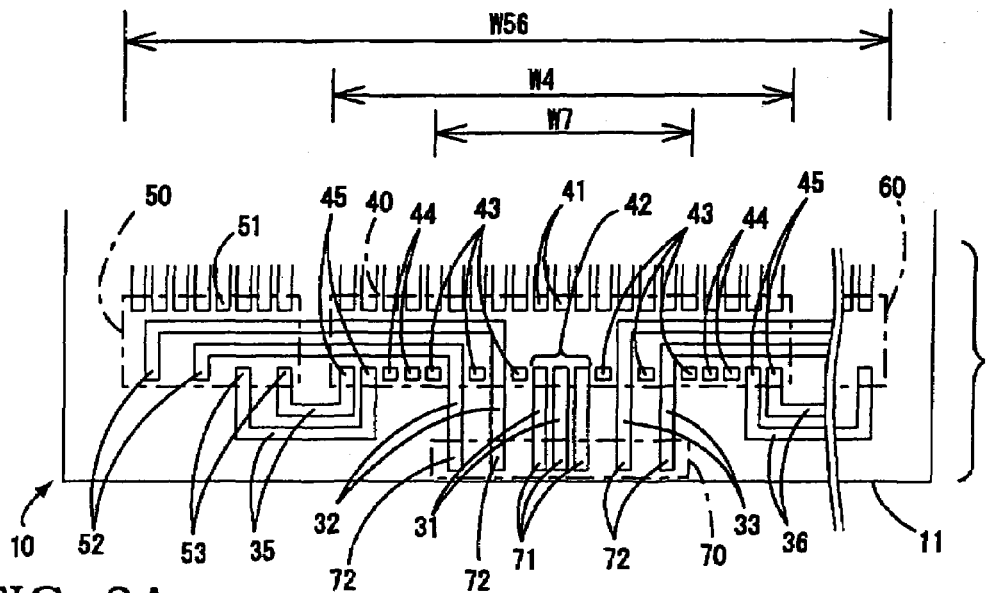
FIG. 3(A) is an enlarged plan view from the center area to the left area of an IC-mounting area of the element substrate used for the electrooptic device according to the present invention and FIG. 3(B) is an enlarged plan view from the center area to the right area of the IC-mounting area.
Figure 3B:
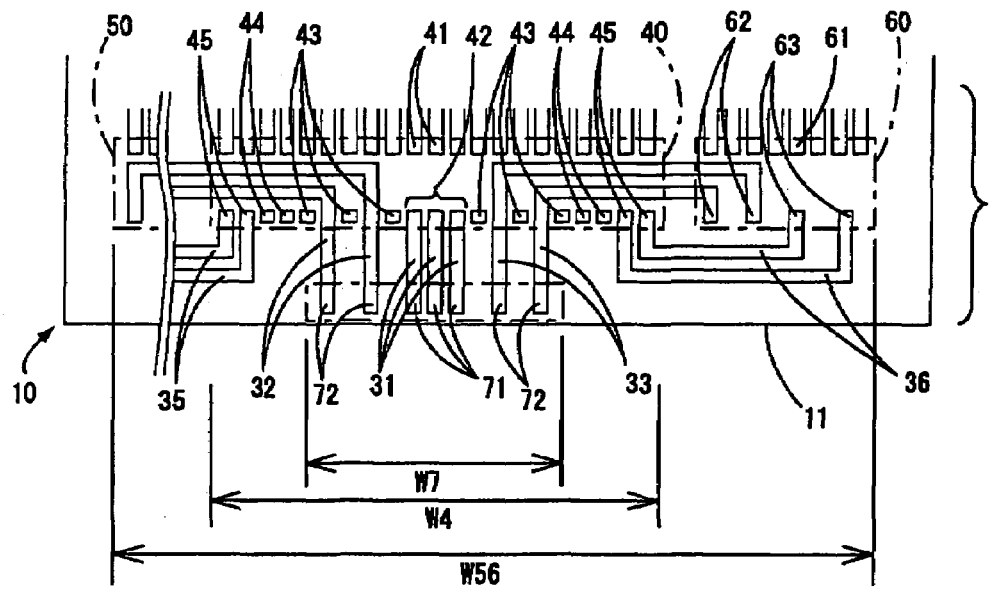

FIG. 3(A) is an enlarged plan view from the center area to the left area of an IC-mounting area of the element substrate used for the electrooptic device according to the present invention and FIG. 3(B) is an enlarged plan view from the center area to the right area of the IC-mounting area. The number of pads shown in FIGS. 3(A) and 3(B) is smaller than that of pads used in practice. That is to say, the number of the pads used in practice is larger than that shown in the drawings.

In this embodiment, a second IC-mounting area 50 on which the second IC 5 including a scan-line driver circuit is COG-mounted, a first IC-mounting area 40 on which the first IC 4 including a data-line driver circuit is COG-mounted, and a second IC-mounting area 60 on which the second IC 6 including another scan-line driver circuit is COG-mounted are formed on the overhanging area 10a of the element substrate 10 following the substrate edge 11 in that order. The second IC-mounting areas 50 and 60 are provided on both sides of the first IC-mounting area 40. Further, a substrate-connection area 70 to which the flexible substrate 7 is connected is formed on the overhanging area 10a of the element substrate 10, so as to extend following the substrate edge 11. That is to say, the substrate-connection area 70 is closer to the substrate edge 11 than the IC-mounting areas 40, 50, and 60.

Many first pads to which a bump of the first IC 4 is connected by using an ACF (anisotropic conductive film) or the like are provided in two rows on the first IC-mounting area 40, so as to extend parallel to the substrate edge 11. Here, the value of a driving voltage of the first IC 4 is five volts, for example.

Of these first pads, an output pad 41 formed by the end of the wiring pattern extending from the data line 52a is provided on the element substrate 10 at a position distant from the substrate edge 11. Further, many input pads 42 are provided in rows in the center area extending in the direction following the substrate edge 11 of the first IC-mounting area 40 at a position near the substrate 11, and a plurality of dummy pads 43 is provided on both sides of the input pads 42. Further, testing-bump-mounting pads 44 to which testing bumps for testing the first IC 4 are connected are provided on both sides of the dummy pads 43. Output pads 45 are provided in rows parallel to the substrate edge 11 at positions adjacent to the outside of the above-described testing-bump-mounting pads 44, where the output pads are used for applying a signal, a power-supply potential, and a ground potential to the second IC 5.

The signal, the power-supply potential, and the ground potential are applied from the flexible substrate 7 to the input pads 42 of the above-described first pads. Therefore, each of the input pads 42 functions as one end of the first wiring pattern 31 that extends linearly from the first IC-mounting area 40 toward the substrate 11 and that reaches the substrate-connection area 70. The other end of the first wiring pattern 31 forms a substrate-connection terminal 71 on the substrate-connection area 70, where the flexible substrate 7 is connected to the substrate-connection terminal 71. However, since the signal, the power-supply potential, and the ground potential are not directly applied to the output pads 41, the dummy pads 43, the testing bumps 44, and the output pads 45, the first wiring pattern 31 extending toward the substrate-connection area 70 is not formed for the above-described pads.

As shown in FIGS. 2 and 3(A), the many second pads to which the bumps of the second IC 5 are connected by the ACF or the like are provided in two rows on the second IC-mounting area 50, so as to extend parallel to the substrate edge 11. Here, the value of a driving voltage of the second IC 5 is thirty volts, for example.

Of these second pads, an output pad 51 formed by the end of the wiring pattern connected to the scan line 51a via the sealing material 30 is provided on the element substrate 10 at a position distant from the substrate edge 11. Further, a plurality of input pads 52 is provided in rows in the second IC-mounting area 50 at a position near the substrate edge 11, where the signal, the power-supply potential, and the ground potential are applied from the flexible substrate 7 to the input pads 52. Further, input pads 53 are provided at a position adjacent to the input pads 52, where the signal, the power-supply potential, and the ground potential are applied from the output pads 45 of the first IC 4.

The signal, the power-supply potential, and the ground potential are directly applied from the flexible substrate 7 to the input pads 52 of the above-described second pads. Therefore, each of the input pads 52 functions as one end of the second wiring pattern 32 extending from the second IC-mounting area 50 toward the substrate-connection area

70. Here, the second wiring pattern 32 extends from the second IC-mounting area 50 toward the first IC-mounting area 40 parallel to the substrate edge 11, and bends at a right angle in the first IC-mounting area 40 toward the substrate edge 11. Further, the second wiring pattern 32 extends linearly between the dummy pads 43 in the first IC-mounting area 40 and reaches the substrate-connection area 70, so that the other end thereof forms a substrate-connection end 72. Further, the input pads 53 in the second IC-mounting area 50 and the output pads 45 in the first IC-mounting area 40 are connected to one another via third wiring patterns 35.

As shown in FIGS. 2 and 3(B), the many second pads to which the bumps of the second IC 6 are connected by the ACF or the like are provided in two rows in the other IC-mounting area, that is, the second IC-mounting area 60, so as to extend parallel to the substrate edge 11. Here, the value of a driving voltage of the second IC 6 is thirty volts, for example.

Of these second pads, each output pad 61 formed by the end of the wiring pattern connected to the scan line 51a via the sealing material 30 is provided on the element substrate 10 at a position distant from the substrate edge 11. Further, a plurality of input pads 62 is provided in rows in the second IC-mounting area 60 at a position near the substrate edge 11, where the signal, the power-supply potential, and the ground potential are applied from the flexible substrate 7 to the input pads 62. Further, input pads 63 are provided at a position adjacent to the input pads 62, where the signal, the power-supply potential, and the ground potential are directly applied from the output pads 45 of the first IC 4 to the input pads 63.

The signal, the power-supply potential, and the ground potential are directly applied from the flexible substrate 7 to the input pads 62 of the above-described second pads. Therefore, each of the input pads 62 is formed as one end of the second wiring pattern 33 extending from the second IC-mounting area 60 toward the substrate-connection area 70. Here, the second wiring pattern 33 extends from the second IC-mounting area 60 toward the first IC-mounting area 40 parallel to the substrate edge 11, and bends at a right angle in the first IC-mounting area 40 toward the substrate edge 11. Then, the second wiring pattern 33 extends linearly between the dummy pads 43 in the first IC-mounting area 40 and reaches the substrate-connection area 70, so that the other end thereof forms the substrate-connection end 72. Further, the input pads 63 in the second IC-mounting area 60 and the output pads 45 in the first IC-mounting area 40 are connected to one another via third wiring patterns 36.

Subsequently, the ICs 4, 5, and 6 are COG-mounted on the IC-mounting areas 40, 50, and 60, and the flexible substrate 7 is connected to the substrate-connection area 70 so that the signal, the power-supply potential, and so forth, are applied thereto via the flexible substrate 7. As a result, the signal, the power-supply potential, and so forth, are supplied to the first IC 4 via the substrate-connection ends 71, the first wiring patterns 31, and the input pads 42. Further, the signal, the power-supply potential, and so forth, are applied to the second ICs 5 and 6 via the substrate-connection ends 72, the second wiring patterns 32 and 33, and the input pads 52 and 62. Still further, the signal, the power-supply potential, and so forth, are applied to the second ICs 5 and 6 via the output pads 45 of the first IC 4, the third wiring patterns 35 and 36, and the input pads 53 and 63.

Advantages of the Embodiment

Thus, according to the above-described embodiment, the first IC-mounting area 40 and the second IC-mounting areas 50 and 60 are formed following the same substrate edge 11 of the element substrate 10, and the flexible substrate 7 is connected to the element substrate 10, so as to be near the substrate edge 11 rather than the IC-mounting areas 40, 50, and 60. Further, the first wiring patterns 31 extend linearly from the first IC-mounting area 40 toward the substrate-connection area 70, and the second wiring patterns 32 and 33 extending from the second IC-mounting areas 50 and 60 toward the substrate-connection area 70 go between the dummy pads 43 formed in the first IC-mounting area 40. Therefore, the substrate-connection ends 71 for applying the signal, the power-supply potential, and the ground potential from the flexible substrate 7 to the first IC 4, and the substrate-connection ends 72 for applying the signal, the power-supply potential, and the ground potential from the flexible substrate 7 to the second ICs 5 and 6 can be provided in a small area in a converging manner. Therefore, it becomes possible to decrease the width W7 of the substrate-connection area 70 (flexible substrate 7) extending in the direction following the substrate edge 11, so as to be substantially smaller than the width (width W56 of an area including the first IC-mounting area 40 and the second IC-mounting areas 50 and 60 extending in the direction following the substrate edge 11) of the element substrate 10. For example, the width W7 of the substrate-connection area 70 can be reduced, so as to be equal to or smaller than the width W4 of the first IC-mounting area 40 extending in the direction following the substrate edge 11. Therefore, where the electronic apparatus is configured as a mobile phone or the like by using the electrooptic device 1a, a connector, a speaker, and so forth, can be easily provided near the substrate edge.

Further, since the first IC 4 and the second ICs 5 and 6 do not necessarily share the use of the substrate-connection ends 71, the circuit configuration can be simplified, even though the power-supply voltage of the first IC 4 and those of the second ICs 5 and 6 are different from one another.

Further, according to this embodiment, the input pads 42 to which the signal, the power-supply potential, and the ground potential are applied from the flexible substrate 7 are integrated in the center area of the first IC-mounting area 40. Further, the pads requiring no substrate-connection ends 71, that is, the dummy pads 43, the testing bumps 44, the output pads 45, and so forth, are provided in areas on both sides of the first IC-mounting area 40. Further, the dummy pads, where the second wiring pattern 32 extends therebetween, are provided in areas adjacent to the input pads 42. Since the substrate-connection ends 71 and 72 can be integrated in a small area in a converging manner, the width W7 of the substrate-connection area 70 (the flexible substrate 7) can be reduced, so as to be smaller than width W4 of the first IC-mounting area 40.

Further, the second wiring patterns 32 and 33 extend between the dummy pads 43 of the first pads. Therefore, where the power-supply potential of the first IC 4 and those of the second ICs 5 and 6 are different from one another, no malfunctions occur, even though the second wiring patterns 32 and 33, and the dummy pads 43 may be short-circuited.

Further, since one of the second wiring patterns 32 and 33 extends through a gap between the dummy pads 43, the width of the gap is small. Since the first pads are provided, so as not to be converged at a predetermined position on a mounting surface of the first IC 4, it becomes possible to reduce mounting failures that may occur in the case where pads are formed over a wide area.

Further, since the positional relationship between the input ends 52 and 53 in the second IC-mounting area 50 is the same as that between the input ends 62 and 63 in the second IC-mounting area 60, ICs of the same specification can be used as the second ICs 5 and 6.

Other Embodiments

In the above-described embodiment, the second IC-mounting areas 50 and 60 are provided on both sides of the first IC-mounting area 40 and the second ICs 5 and 6 of the same type are mounted on the second IC-mounting areas 50 and 60. However, the present invention can be used in the case where the configurations of the second IC-mounting areas 50 and 60, which are formed on both sides of the first IC-mounting area 40, are different from each other, and the configurations of the second ICs 5 and 6 are different from each other.

Further, the present invention can be used for the case where a single second IC-mounting area is provided on one of the two sides of the first IC-mounting area 40. In this case, the first IC-mounting area 40 may be provided in either the center area, or the end area extending in the direction following the substrate edge.

Further, according to the above-described embodiments, the present invention is described for the active-matrix liquid-crystal device using the TFD, as the non-linear element. However, an IC including a driver circuit can be COG-mounted on the electrooptic-device substrate in the following electrooptic device. Therefore, the present invention can be used for this electrooptic device.

Figure 4:
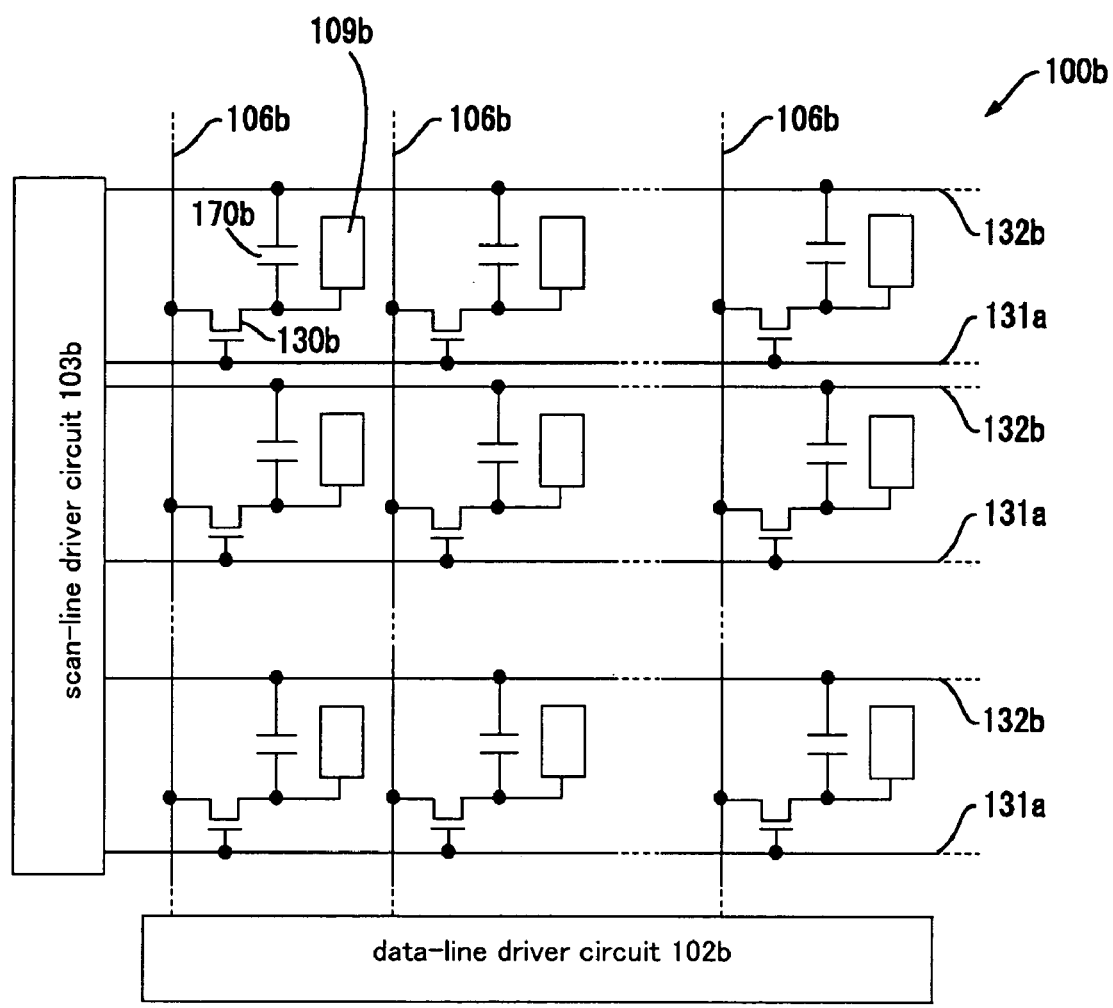
FIG. 4 is a block diagram schematically showing the configuration of an electrooptic device comprising an active-matrix liquid-crystal unit using a thin-film transistor (TFT), as a pixel switching element.
Figure 5:
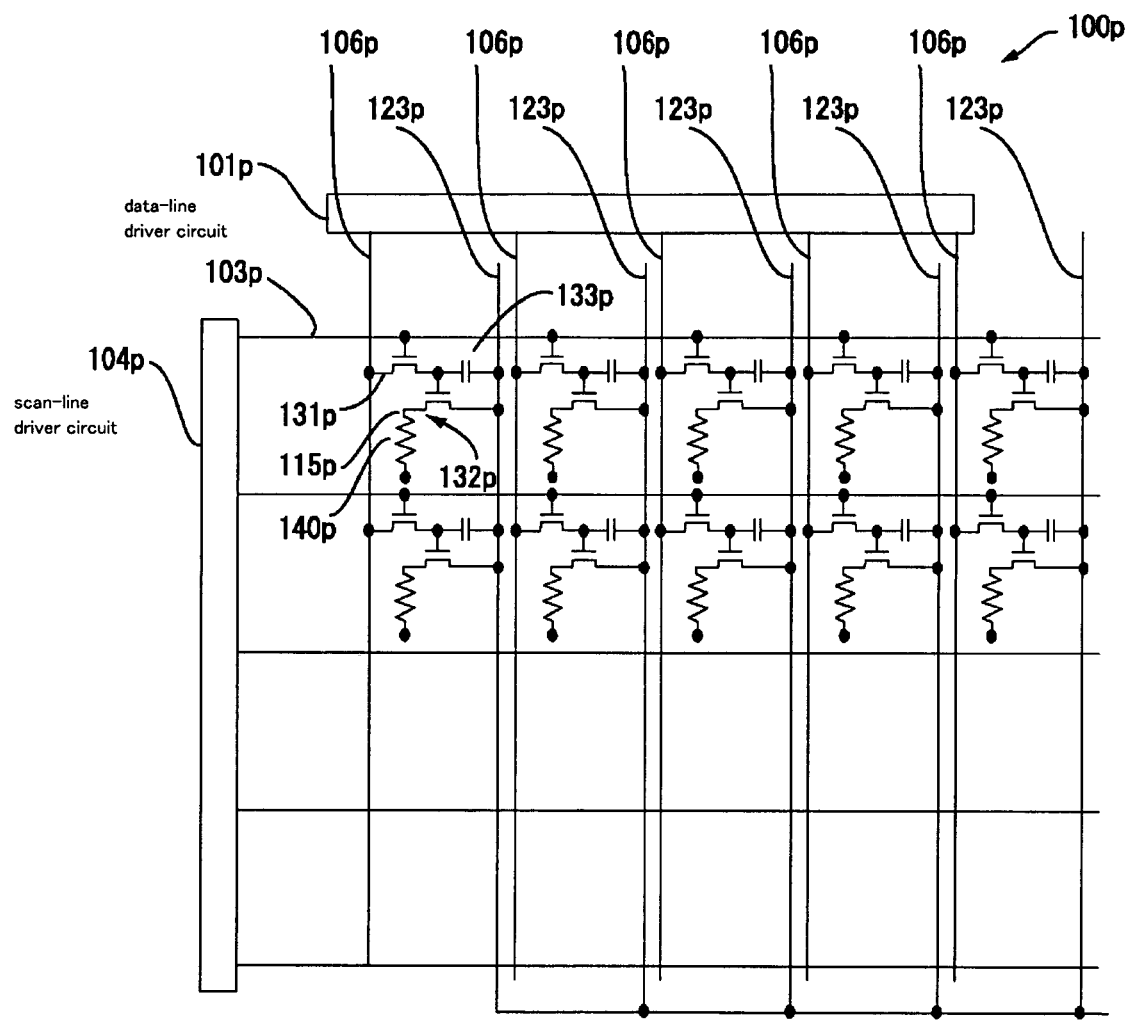
FIG. 5 is a block diagram of an active-matrix electrooptic unit including an electroluminescence element using an electrical-charge-injection organic thin film, as an electrooptic substance.

FIG. 4 is a block diagram schematically showing the configuration of an electrooptic device comprising an active-matrix liquid-crystal device using a thin-film transistor (TFT) as a pixel switching element. FIG. 5 is a block diagram of an active-matrix electrooptic device including an electroluminescence element using an electrical-charge-injection organic thin film as an electrooptic substance.

As shown in FIG. 4, in an electrooptic device 100$b$ comprising the active-matrix liquid-crystal device using the TFT, as the pixel switching element, a TFT 130$b$ for pixel switching is formed in each of a plurality of pixels provided in matrix form, where the TFT 130$b$ is used for controlling a pixel electrode 109$b$. Further, a data line 106$b$ for applying an image signal is electrically connected to the source of the TFT 130$b$. The image signal written into the data line 106$b$ is applied from a data-line driver circuit 102$b$. Further, a scan line 131$a$ is electrically connected to a gate of the TFT 130$b$ and a scan signal is applied from a scan-line driver circuit 103$b$ to the scan line 131$b$ in a pulse-like manner with predetermined timing. A pixel electrode 109$b$ is electrically connected to a drain of the TFT 130$b$. The image signal applied from the data line 106$b$ is written into each pixel with predetermined timing by turning on the TFT 130$b$, which functions as the switching element, for a predetermined time period. Accordingly, a sub-image signal at a predetermined level written into the liquid crystal via the pixel electrode 109$b$ is maintained for a predetermined time period between an opposing substrate (not shown) and an opposing electrode formed thereon.

An accumulation capacitance 170$b$ (capacitor) is often added in parallel with a liquid-crystal capacitance formed between the pixel electrode 109$b$ and the opposing electrode, so as to prevent leakage of the maintained sub image signal. By using this accumulation capacitance 170$b$, the voltage of the pixel electrode 109$b$ is maintained for a time period one thousand times longer than a time period required for applying a source voltage. Subsequently, the electrical-charge maintaining characteristic increases, whereby an electrooptic device for performing display with a high contrast ratio can be achieved. The accumulation capacitance 170$b$ may be provided between a capacitance line 132$b$ functioning as wiring for forming the capacitance and the TFT 130$b$, or between the scan line 131$b$ and the TFT 130$b$.

As shown in FIG. 5, an active-matrix electrooptic device 100$p$ comprising the electroluminescence element using an electrical-charge-injection organic thin film is an active-matrix display device for driving and controlling a light-emitting element by using the TFT. The light-emitting element includes an EL (electroluminescence) element that emits light where a driving current passes through the organic semi-conductive film, an LED (light emitting diode) element, and so forth. Since any light-emitting element used for the above-described type of display device emits light, the active-matrix electrooptic device 100$p$ does not require a backlight and has little viewing-angle dependence.

The electrooptic device 100$p$ includes a plurality of scan lines 103$p$, a plurality of data lines 106$p$ extending in a direction that crosses the direction in which the scan lines 103$p$ extend, a plurality of common feed lines 123$p$ extending parallel to the data lines 106$p$, and pixels 115$p$, where each of the pixels 115$p$ is provided at each intersection of the data lines 106$p$ and the scan lines 103$p$. A data-line driver circuit 101$p$ including a shift register, a level shifter, a video line, and an analog switch is provided for the data lines 106$p$. A scan-line driver circuit 104$p$ including a shift register and a level shifter is provided for the scan lines 103$p$.

Each of the pixels 115$p$ includes a first TFT 131$p$, wherein a scan signal is applied to the gate electrode thereof via the scan line 103$p$, a storage capacitor 133$p$ for storing an image signal applied from the data line 106$p$ via the first TFT 131$p$, a second TFT 132$p$, wherein the image signal stored in the storage capacitor 133$p$ is applied to the gate electrode of the second TFT 132$p$, and a light emitting element 140$p$. Where the light-emitting element 140$p$ is electrically connected to the common feed line 123$p$ via the second TFT 132$p$, a driving current flows from the common feed line 123$p$ into the light emitting element 140$p$.

Here, in the light-emitting element 140$p$, an organic semi-conductive film functioning as a positive-hole injection layer and an organic electroluminescence material layer, and an opposing electrode formed by a metal film including lithium-containing aluminum, calcium, and so forth, are stacked on each other on an upper layer of the pixel electrode. The opposing electrode is provided over the data lines 106$p$, so as to spread out over the plurality of pixels 115$p$.

Without being limited to the above-described embodiments, the present invention can be used for various types of electrooptic devices including a plasma display device, an FED (field emission display) device, an LED (light-emitting diode) display device, an electrophoretic display device, a low-profile cathode-ray tube, a small television using a liquid-crystal shutter or the like, an apparatus using a digital micro-mirror device (DMD), and so forth.

Further, the above-described electrooptic device can be used as a display of various types of electronic apparatuses including a mobile phone, a mobile computer, and so forth.

INDUSTRIAL APPLICABILITY

According to the present invention, the first wiring pattern extends from the first IC-mounting area toward the substrate-connection area, and the second wiring pattern extending from the second IC-mounting area toward the substrate-connection area is provided so as to extend between first pads formed on the first IC-mounting area. Therefore, the substrate-connection ends for applying a signal, a power-supply potential, or a ground potential from the flexible substrate to the first IC, and substrate-connection ends for applying a signal, a power-supply potential, and a ground potential from the flexible substrate to the second IC can be provided in a converging manner. Therefore, it becomes possible to decrease the width of the substrate-connection area extending in the direction following the substrate edge. Subsequently, the width of the flexible substrate extending in the direction following the substrate edge can be decreased so as to be substantially smaller than that of the electrooptic-device substrate. Therefore, where an electronic apparatus is configured as a mobile phone or the like by using the electrooptic device, a connector, a speaker, and so forth, can be easily provided near the substrate edge.

What is claimed is:

1. An electrooptic device comprising:
    an electrooptic-device substrate including:
        a substrate edge;
        a first IC-mounting area for mounting a first IC and a second IC-mounting area for mounting a second IC, the first IC-mounting area and the second IC-mounting area being aligned along the substrate edge; and
        a substrate-connection area to which a flexible substrate is to be connected, the substrate-connection area being nearer the substrate edge than the first and second IC-mounting areas;
    a first wiring pattern extending from the first IC-mounting area to the substrate-connection area; and
    a second wiring pattern extending from the second IC-mounting area, between first pads formed in the first IC-mounting area, and reaching the substrate-connection area.

2. The electrooptic device according to claim 1, wherein:
    the first wiring pattern extends substantially linearly from the first IC-mounting area toward the substrate-connection area; and
    the second wiring pattern extends substantially linearly from between the first pads toward the substrate-connection area.

3. The electrooptic device according to claim 1, wherein an area in which the first wiring pattern is formed and an area in which the second wiring pattern is formed are adjacent to each other in a direction following the substrate edge of the electrooptic-device substrate.

4. The electrooptic device according to claim 1, wherein:
    the first IC-mounting area is formed in a substantially center area of the electrooptic-device substrate, the center area extending in the direction following the substrate edge, and
    the second IC-mounting area is formed on both sides of the first IC-mounting area extending in the direction following the substrate edge of the electrooptic-device substrate.

5. The electrooptic device according to claim 1, wherein the first and second IC-mounting areas are arranged so that a single first IC-mounting area and a single second IC-mounting area are provided in the direction following the substrate edge of the electrooptic-device substrate.

6. The electrooptic device according to claim 1, wherein a width of the substrate-connection area extending in the direction following the substrate edge is smaller than a width of a predetermined area including the first IC-mounting area and the second IC-mounting area, the predetermined area extending in the direction following the substrate edge.

7. The electrooptic device according to claim 6, wherein the width of the substrate-connection area extending in the direction following the substrate edge is equal to or smaller than a width of the first IC-mounting area extending in the direction following the substrate edge.

8. The electrooptic device according to claim 1, wherein the second wiring pattern includes a single second wiring pattern extending through a gap between the first pads.

9. The electrooptic device according to claim 1, wherein:
    the second wiring pattern extends between dummy pads of the first pads and extends to the substrate-connection area; and
    a signal, a power-supply potential, and a ground potential are not applied from the flexible substrate to the dummy pads.

10. The electrooptic device according to claim 1, wherein:
    the first pads include a pad connected to a second pad formed in the second IC-mounting area by a third wiring pattern;
    the pad is provided on an end of the first IC-mounting area, the end being formed at a predetermined position near the second IC-mounting area; and
    the signal, the power-supply potential and the ground potential are not directly applied from the flexible substrate to the pad.

11. The electrooptic device according to claim 1, wherein:
    the first pads include a pad to which a bump for testing the first IC is connected; and
    the pad is provided in the first IC-mounting area at a predetermined position that is nearer an end than a predetermined area; and
    the first pads are formed in the predetermined area and the second wiring pattern extends therebetween.

12. The electrooptic device according to claim 1, wherein the electrooptic-device substrate holds a liquid crystal between the electrooptic-device substrate and another substrate opposing thereto.

13. The electrooptic device according to claim 1, wherein the electrooptic-device substrate holds an organic electroluminescence material forming an electroluminescence element.

14. An electronic apparatus including the electrooptic device according to claim 1. cm 15. An electrooptic device comprising:
    a substrate having a substrate edge and a substrate-connection area in the vicinity of the substrate edge, the substrate connection area being for connecting a flexible substrate thereto;
    a first IC mounted on the substrate at a position farther from the substrate edge than the substrate connection area;
    a second IC mounted on the substrate at a position farther from the substrate edge than the substrate connection area;
    a first wiring pattern extending from under the first IC to the substrate-connection area; and
    a second wiring pattern extending from under the second IC, to under the first IC, and reaching the substrate-connection area.

* * * * *